US006815643B2

(12) United States Patent
Der Ropp

(10) Patent No.: US 6,815,643 B2
(45) Date of Patent: Nov. 9, 2004

(54) SEMICONDUCTOR DEVICE WITH TEMPERATURE REGULATION

(75) Inventor: Thomas Von Der Ropp, Germering (DE)

(73) Assignee: Infineon Technologies AG, Munich (DE)

(*) Notice: Subject to any disclaimer, the term of this patent is extended or adjusted under 35 U.S.C. 154(b) by 53 days.

(21) Appl. No.: 09/906,452

(22) Filed: Jul. 16, 2001

(65) Prior Publication Data

US 2002/0030239 A1 Mar. 14, 2002

(30) Foreign Application Priority Data

Jul. 14, 2000 (DE) .......................................... 100 34 262

(51) Int. Cl.[7] .............................................. H05B 1/00
(52) U.S. Cl. ........................... 219/209; 327/513; 62/3.7
(58) Field of Search ................................. 219/209, 210, 219/481, 494, 548; 324/158.1, 760; 327/513, 573; 62/3, 7; 326/93; 713/501; 361/31, 771; 257/717; 237/2 A

(56) References Cited

U.S. PATENT DOCUMENTS

| 5,233,161 | A | * | 8/1993 | Farwell et al. ............... 219/209 |
| 5,294,050 | A | * | 3/1994 | Hoffman et al. ............. 237/2 A |
| 5,406,212 | A | * | 4/1995 | Hashinaga et al. .......... 324/760 |
| 5,436,502 | A | * | 7/1995 | Kuhnert et al. .............. 257/717 |
| 5,473,259 | A | * | 12/1995 | Takeda ........................ 324/760 |
| 5,481,210 | A | | 1/1996 | Genzel |
| 5,517,053 | A | | 5/1996 | Dietz et al. |
| 5,539,186 | A | * | 7/1996 | Abrami et al. ............... 219/548 |
| 5,574,627 | A | * | 11/1996 | Porter ......................... 361/719 |
| 5,625,288 | A | * | 4/1997 | Snyder et al. ............. 324/158.1 |
| 5,723,998 | A | * | 3/1998 | Saito et al. .................. 327/513 |
| 5,798,667 | A | * | 8/1998 | Herbert ....................... 327/573 |
| 5,875,142 | A | | 2/1999 | Chevallier |
| 5,948,106 | A | | 9/1999 | Hetherington et al. |
| 5,951,893 | A | * | 9/1999 | Bitko et al. .................. 219/209 |
| 6,002,240 | A | | 12/1999 | McMahan et al. |
| 6,031,729 | A | * | 2/2000 | Berkely et al. ............. 361/771 |
| 6,055,815 | A | | 5/2000 | Peterson |
| 6,400,101 | B1 | * | 6/2002 | Biebi et al. .................. 315/291 |
| 6,400,539 | B1 | * | 6/2002 | Sekiguchi et al. ............ 361/31 |
| 6,489,793 | B2 | * | 12/2002 | Jones et al. ................. 324/760 |

FOREIGN PATENT DOCUMENTS

| DE | 43 40 284 C1 | 6/1995 |
| DE | 197 45 040 A1 | 8/1998 |
| EP | 0 631 220 A2 | 12/1994 |
| JP | 60 085 552 | 5/1985 |
| WO | 92/10032 | 6/1992 |

* cited by examiner

Primary Examiner—Robin O. Evans
Assistant Examiner—Leonid M Fastovsky
(74) Attorney, Agent, or Firm—Laurence A. Greenberg; Werner H. Stemer; Gregory L. Mayback

(57) ABSTRACT

A semiconductor device is described in which an integrated circuit executes dummy operating cycles in order to generate heat if the temperature of the semiconductor device drops below a lower limit value. In this manner the semiconductor device can be rated for lower temperatures than the construction tolerances of the semiconductor device would allow.

5 Claims, 1 Drawing Sheet

SEMICONDUCTOR DEVICE WITH TEMPERATURE REGULATION

BACKGROUND OF THE INVENTION

Field of the Invention

The present invention relates to a semiconductor device having at least one integrated circuit realized in a semiconductor module, a current and/or voltage supply, a temperature identification device, which can ascertain a temperature of the semiconductor module, and a control unit connected to the temperature identification device.

In various applications, semiconductor modules have to remain operational even at low temperatures of up to −40° C. This applies for example to semiconductor modules appertaining to automotive electronics, mobile data transmission and communication technology, and generally to semiconductor modules installed outside.

In order to satisfy this requirement, in semiconductor devices semiconductor modules have hitherto been equipped in such a way that they can withstand the above-mentioned low temperatures of up to −40° C. and exhibit a satisfactory operating behavior even under such unfavorable conditions. In other words, operating range and performance of semiconductor modules realized in semiconductor devices have hitherto been extended to such a degree that they can withstand extremely low temperatures.

Another possibility for ensuring a satisfactory operating behavior even at extremely low temperatures is to select suitable semiconductor modules for these low temperatures. Such a procedure is rather complex, however, since there is an absolute necessity to check all the semiconductor modules with regard to their suitability for extremely low temperatures.

It would be desirable, then, if there were semiconductor devices capable of withstanding extremely low temperatures without being specially adapted to operation at these low temperatures. In other words, semiconductor devices whose operating range and performance are adapted to temperatures of up to about −10° C. or −20° C. but which can nevertheless withstand even lower temperatures of up to −40° C. under extreme conditions would be highly advantageous.

SUMMARY OF THE INVENTION

It is accordingly an object of the invention to provide a semiconductor device with temperature regulation which overcomes the above-mentioned disadvantages of the prior art devices and methods of this general type, which has temperature regulation and can withstand even temperatures of up to −40° C. or lower without its operating range and its performance being specially adapted to such low temperatures.

With the foregoing and other objects in view there is provided, in accordance with the invention, a semiconductor device containing a semiconductor module having at least one integrated circuit, a temperature identification device for ascertaining a temperature of the semiconductor module and a control unit connected to the temperature identification device and to the integrated circuit. If a temperature ascertained by the temperature identification device falls below a lower limit value, the control unit causes the integrated circuit to execute dummy operating cycles. A power supply unit is connected to the semiconductor module.

In the case of the semiconductor device of the type mentioned in the introduction, the object is achieved according to the invention by virtue of the fact that when the temperature ascertained by the temperature identification device falls below a lower limit value, the control unit causes the integrated circuit to execute dummy operating cycles.

In other words, in the semiconductor device according to the invention, there is preferably provided in the semiconductor module the temperature identification device containing a diode, for example, which, when a lower limit value, for example, 0° C. or −25° C., is undershot, causes the integrated circuit realized in the semiconductor module to perform dummy operating cycles, such as, for example, additional refresh cycles, a so-called self-refresh in a semiconductor memory, or else NOP (no operation) cycles, in which no operating program runs. Heat is generated by the dummy operating cycles when the temperature falls below the lower limit value, with the result that the temperature of the semiconductor module, in which preferably the integrated circuit, the temperature identification device and the control unit are integrated, is prevented from dropping below the lower limit temperature of, for example, −25° C. Therefore, the semiconductor module can be used even in an environment of −40° C. or below, since its temperature does not drop below approximately −25° C. on account of the dummy operating cycles.

A development of the invention provides for an oscillator connected to the control unit to be provided as an additional current load, the oscillator being activated when the lower limit temperature is undershot in order thus to additionally generate heat through its current consumption. Such an oscillator serving only for heat generation purposes does, however, take up additional area on the chip of the semiconductor module.

If a diode is used as the temperature identification device, then its reverse or else forward resistance, for example, can be measured for the purpose of ascertaining the temperature. Instead of a diode, however, it is also possible to use other suitable components for temperature identification. All that is important is that the temperature identification device ascertains that a lower limit value has been undershot, with the result that the control unit connected to the temperature identification device is able to trigger a heat generation process by dummy operating cycles in the integrated circuit and/or a separate oscillator.

In the case of the semiconductor device according to the invention, it is a significant advantage that the performance and operating range of the integrated circuit realized in the semiconductor module do not have to be extended to the low-temperature range of up to −40° C. As a result, the outlay for the integrated circuit or the semiconductor module can be considerably reduced. Complicated selections of semiconductor devices that are suitable for the low temperature range of up to −40° C. and below can be avoided. Likewise, it is no longer necessary to test semiconductor devices or semiconductor modules with regard to their low-temperature suitability, since this is given anyway through the processing of the dummy operating cycles.

Other features which are considered as characteristic for the invention are set forth in the appended claims.

Although the invention is illustrated and described herein as embodied in a semiconductor device with temperature regulation, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
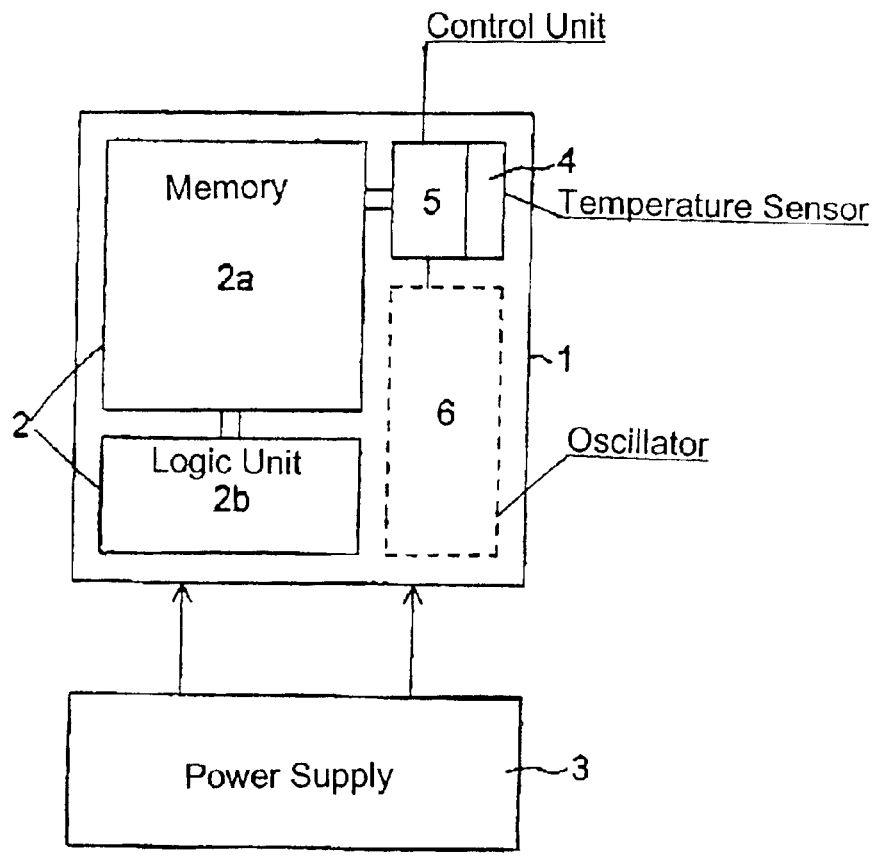
FIG. 1 is a block circuit diagram of an exemplary embodiment of a semiconductor device according to the invention.

In all the figures of the drawing, sub-features and integral parts that correspond to one another bear the same reference symbol in each case. Referring now to the figures of the drawing in detail and first, particularly, to FIG. 1 thereof, there is shown a semiconductor module 1 having an integrated circuit 2, formed of for example, a memory 2a and a memory logic unit 2b, and furthermore having a temperature identification device 4, a control unit 5 connected to the temperature identification device 4, and if appropriate (shown by dashed lines) an oscillator 6. A current and/or voltage supply 3 is connected to the semiconductor module 1, but, if appropriate, it may also be contained in the semiconductor module 1.

Figure 2:
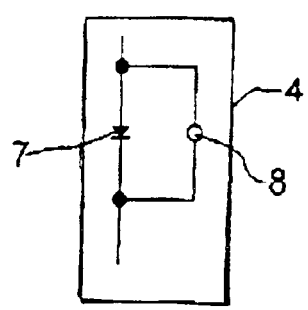
FIG. 2 is a schematic diagram of a temperature identification device in the form of a diode.

The temperature identification device 4 may contain, for example, a diode 7 whose reverse or forward resistance is measured by a corresponding measuring unit 8 (FIG. 2). In this way, the temperature in the environment of the diode 7 can be inferred from the characteristic curve of the diode 7.

If the temperature ascertained by the temperature identification device 4 falls below a lower limit value of, for example, −25° C., then the control unit 5 connected to the temperature identification device 4 causes the integrated circuit 2 to execute dummy operating cycles, as a result of which current and/or voltage from the current and/or voltage supply 3 is consumed and heat is thus generated. In this way, the temperature in the region of the semiconductor module 1 can be prevented from dropping to temperatures significantly below −25° C., even though the ambient temperature is −40° C., for example.

The additional outlay for the temperature identification device 4 and the control unit 5 is relatively low compared with the gain that is attained, since performance and operating range of the semiconductor module 1 no longer need be configured for temperatures of up to −40° C.

If appropriate, the oscillator 6 may additionally be provided on the semiconductor module 1. The oscillator 6 generates heat when the temperature falls below the lower limit value, and thus prevents the semiconductor module from falling to temperatures below −25° C., for example.

I claim:

1. A semiconductor device, comprising:
   a semiconductor module having at least one integrated circuit;
   a temperature identification device for ascertaining a temperature of said semiconductor module;
   a control unit connected to said temperature identification device and to said integrated circuit, upon a temperature ascertained by said temperature identification device falling below a lower limit value of 0° C. to −25° C., said control unit causing said integrated circuit to execute dummy operating cycles to avoid a cooling of said semiconductor module to a temperature below the limit value; and
   a power supply unit connected to said semiconductor module.

2. The semiconductor device according to claim 1, wherein said integrated circuit, said temperature identification device and said control unit are provided in said semiconductor module.

3. The semiconductor device according to claim 1, wherein said semiconductor module contains an additional current load for heat generation purposes and said additional current load is connected to said control unit.

4. The semiconductor device according to claim 3, wherein said additional current load is an oscillator.

5. The semiconductor device according to claim 1, wherein said temperature identification device has a diode whose forward resistance is measured.

* * * * *